(12) United States Patent
Fan et al.

(10) Patent No.: US 7,173,849 B2
(45) Date of Patent: Feb. 6, 2007

(54) METHOD OF PROGRAMMING AND ERASING MULTI-LEVEL FLASH MEMORY

(75) Inventors: Tso-Hung Fan, Taipei Hsien (TW); Chih-Chieh Yeh, Hsinchu (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/198,684

(22) Filed: Aug. 4, 2005

(65) Prior Publication Data

US 2005/0270844 A1    Dec. 8, 2005

Related U.S. Application Data

(62) Division of application No. 10/065,761, filed on Nov. 15, 2002, now Pat. No. 6,958,934.

(30) Foreign Application Priority Data

Jan. 17, 2002   (TW) .............................. 91100639 A

(51) Int. Cl.
*G11C 16/02*  (2006.01)

(52) U.S. Cl. ..................... 365/185.03; 365/185.33; 365/185.18; 365/185.19; 365/185.24; 365/185.2; 365/185.22

(58) Field of Classification Search .......... 365/185.03, 365/185.33, 185.18, 185.19, 185.24, 185.22
See application file for complete search history.

(56) References Cited

U.S. PATENT DOCUMENTS

| | | | | |
|---|---|---|---|---|
| 4,225,946 A * | 9/1980 | Neale et al. ................. | 365/163 |
| 5,732,022 A * | 3/1998 | Kato et al. ............. | 365/185.24 |
| 5,835,414 A * | 11/1998 | Hung et al. ............ | 365/185.25 |
| 5,969,991 A * | 10/1999 | Van Houdt et al. ..... | 365/185.28 |
| 6,134,140 A * | 10/2000 | Tanaka et al. ......... | 365/185.03 |
| 6,282,125 B1 * | 8/2001 | Pasotti et al. .......... | 365/185.29 |
| 6,285,593 B1 * | 9/2001 | Wong ..................... | 365/185.23 |
| 6,490,204 B2 * | 12/2002 | Bloom et al. .......... | 365/185.28 |
| 6,496,417 B1 * | 12/2002 | Shiau et al. ............. | 365/185.2 |
| 6,643,181 B2 * | 11/2003 | Sofer et al. ............ | 365/185.22 |
| 6,731,557 B2 * | 5/2004 | Beretta ....................... | 365/222 |
| 6,888,757 B2 * | 5/2005 | Lusky et al. ........... | 365/185.22 |
| 6,894,931 B2 * | 5/2005 | Yaegashi et al. ....... | 365/185.22 |
| 6,940,752 B2 * | 9/2005 | Tanaka et al. ......... | 365/185.03 |

* cited by examiner

Primary Examiner—Viet Q. Nguyen
(74) Attorney, Agent, or Firm—J.C. Patents

(57) ABSTRACT

A programming method of the multi-level flash memory comprises shooting a programming voltage that is increasing upwards stepwise each time into the gate of the multi-level flash memory, and following, shooting a program verify voltage that is decreasing downwards to program a multi-level in the multi-level flash memory and shooting an additional programming voltage into the multi-level flash memory after the last program verify voltage is shot. An erasing method of the multi-level flash memory comprises shooting an erasing voltage that is decreasing downwards stepwise each time into a gate of the multi-level flash memory, and following, shooting a erase verify voltage that is increasing upwards to erase a multi-level in the multi-level flash memory and shooting an additional voltage into the multi-level flash memory after the last erase verify voltage is shot.

6 Claims, 4 Drawing Sheets

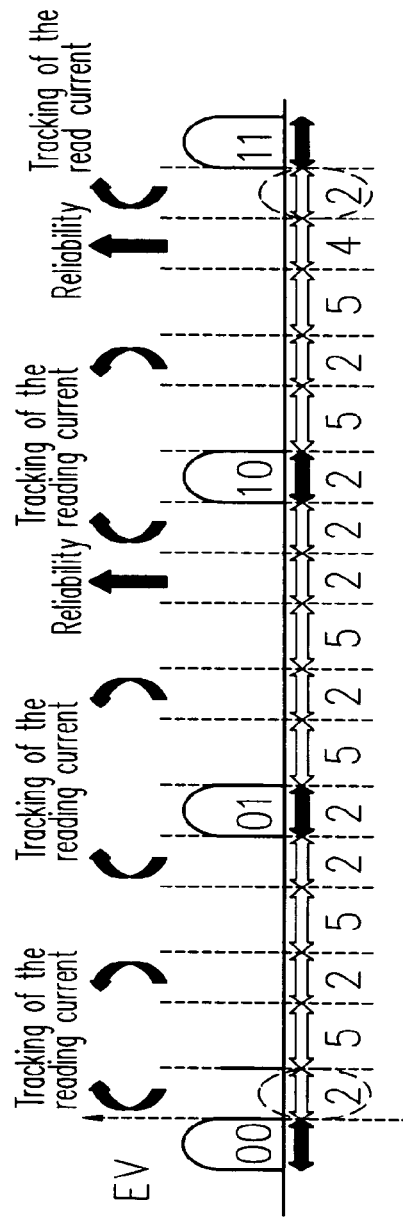
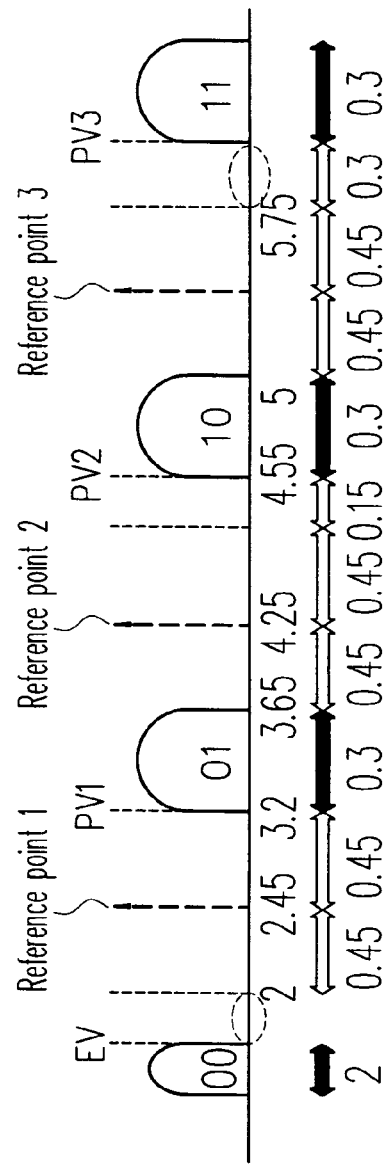
FIG. 2A
FIG. 2B

METHOD OF PROGRAMMING AND ERASING MULTI-LEVEL FLASH MEMORY

CROSS-REFERENCE TO RELATED APPLICATION

The application is a divisional application of, and claims the priority benefit of, U.S. application serial No. 10/065,761 filed on Nov. 15, 2002, now U.S. Pat. No. 6,958,939 claims the priority benefit of Taiwan application serial no. 91100639, filed Jan. 17, 2002.

BACKGROUND OF THE INVENTION

1. Field of Invention

The present invention generally relates to a programming and erasing method of flash memory, and more particularly, to a programming and erasing method of multi-level flash memory.

2. Description of Related Art

In the process of programming and erasing a flash memory bit, in order to have the flash memory describe the binary state and the trinity state, or . . . state, (00, 01, 10, 11 state or 000, 001, 010, 011, 100, 101, 110, 111 state, or . . . state), the means of changing the gate voltage of the flash memory periodically is commonly used to limit the number of the gate voltage shooting times, so that the channel of the flash memory is able to generate the channel hot electrons, and the state when the channel hot electrons are injected to the floating gate via the channel can be different. For example, in order to have multi-level flash memory that represents the binary state describing the multi-level state of the binary bit, its floating gate must have the capacity to store electrons with four different electron distribution states. When the flash memory represents the 00 state value, there is an electron distribution corresponding to the 00 state value stored in the floating gate.

The conventional programming method of the flash memory is: when the flash memory programs from state 00 to 01, 10 or 11 state, the gate voltage Vg is shot into the gate of the flash memory. The gate voltage Vg is increased by 0.1 volt every time it is shot into the gate (i.e. $\Delta Vg$ is 0.1 volt), and is sustained for about 150 ns every time. The programming of flash memory to the 01 or 10 or 11 states from 00 state is determined by the number of times the gate voltage Vg is shot into gate. Where a program verify voltage is carried by the programming voltage in each operation.

When the flash memory is erased to 00 state from 01 or 10 or 11 state, the gate voltage Vg is decreased by 0.5 volt every shot into the gate (i.e. $\Delta Vg$ is $-0.5$ volt), and is sustained for about 100~500 μs every time. The number of times the gate voltage Vg is shot into the gate to erase to 00 state from 01 or 10 or 11 states. Where an erase verify voltage is carried by the erasing voltage in each operation.

Referring to FIG. 1, when the flash memory is programmed to 01 state from 00 state, the gate voltage Vg initially at 5 volts, and $\Delta Vg$ of 0.1 volt, the source voltage of ground, and the drain voltage Vd of 4.5±0.25 volt are shot 20 times. When the flash memory is programmed to 10 state from 00 state, the gate voltage Vg initially at 5 volts, and $\Delta Vg$ of 0.1 volt, the source voltage of ground, and the drain voltage Vd of 4.5±0.25 volt are shot for 40 times. When the flash memory is programmed to 11 state from 00 state, the gate voltage Vg initially at 5 volts, and $\Delta Vg$ of 0.1 volt, the source voltage of ground, and the drain voltage Vd of 4.5±0.25 volt are shot for 60 times. In addition to the different number of shot times respectively corresponding to the different states, the last gate voltage Vg shot is the program verify voltage PV, and all the shots including the second to last Vg shot before the very last shot is the program voltage PGM.

When the flash memory performs an erase operation from 01 or 10 or 11 state to 00 state, the source voltage Vs and the bulkvolt Vb of +8±0.25 volt, the gate voltage Vg initially −6 volts with $\Delta Vg$ is −0.5 volt are shot 5 times.

FIG. 2A and FIG. 2B show the distribution of the reading current Ir and the initial voltage Vt when the programming and erasing of the flash memory are finished and the flash memory state is determined. During programming of the multi-flash memory, if the sense margin in each tracking of the reading current is not high enough misjudgments of the multi-flash memory will easily occur. The problem is more likely to happen at the lowest state or highest state. As shown in FIG. 2A, the tracking of the reading current Ir is distributed in all the 00, 01, 10 and 11 states, and the reliability interval exists in between the tracking of the reading current Ir. The sense margin of each state comprises the partial range of the corresponding tracking of the reading current Ir. The reliability interval for separating each tracking of the reading current Ir is quite narrow. Furthermore, the reliability interval also limits the increase of the sense margin, and so engenders errors, especially when the flash memory is in 00 or 11 state. In FIG. 2B, the voltage interval of the operation initial voltage Vt for determining the state of the flash memory is also too narrow, so as to easily engender errors especially when the flash memory is in 00 or 11 state.

SUMMARY OF THE INVENTION

In view of this, the present invention provides a programming method of the multi-level flash memory for decreasing the tracking range of the reading current Ir and decreasing the voltage range of the operation initial voltage Vt. As a result, fewer errors occur when judging the multi-level flash memory to provide correct segmentation of the multi-flash memory using the same number of states in a smaller tracking range of the reading current when designing the judgment of the multi-level flash memory.

The present invention provides a programming method of the multi-level flash memory, comprising: comprises shooting a stepwise increasing upwards programming voltage into to the gate of the multi-level flash memory to change the state of the multi-flash memory. An additional programming shot is performed after the multi-flash reaches the highest state.

The present invention further provides an erasing method of the multi-level flash memory, comprising: shooting a stepwise decreasing downwards erasing voltage into the gate of the multi-level flash memory to clear the state of the multi-level flash memory. An additional erasing shot is performed after the last erase shot during any state of the multi-level flash.

In summary, the present invention increases the potential of the programming voltage of the multi-level flash memory and decreases the potential of the erasing electron of the multi-level flash memory by adding one additional programming voltage and one additional erase voltage, so that when the multi-level flash memory is programmed, a smaller reading current tracking range and a smaller voltage tracking range of the operation initial voltage are provided, thus fewer errors occur.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention. In the drawings, FIG. 1 schematically shows a conventional programming and erasing method of the flash memory;

FIG. 2A shows the conventional reading current tracking diagram of the flash memory;

FIG. 2B shows the conventional initial voltage tracking diagram when the flash memory is read;

DESCRIPTION OF THE PREFERRED EMBODIMENTS

The present invention applies the gate voltage to the gate of the flash memory and applies the drain voltage to the drain of the flash memory. The source is grounded, and the voltage value of the gate voltage shot into the gate is increased upward stepwise, so that the hot electrons in the flash memory channel are injected and stay in the floating gate of the flash memory via the channel. The electrons in the floating gate are provided with different electron distribution due to different gate voltage shot times to represent flash memory having different states. When the method is applied to a full program of the flash memory, an additional program verify voltage is shot into the gate of the flash memory. That is, if 20 voltage shots are needed for the flash memory to program the state value of 01, 20 programming voltages and one additional gate voltage is shot. When multi-flash memory of the present invention erases the flash memory, the gate voltage is applied to the gate of the flash memory, or the source voltage is applied to the source of the flash memory and is +8±0.25 volt, and the bulkvolt is applied to the base of the flash memory, and the drain is floating. The voltage value of the gate voltage that is shot into the gate is decreased downward stepwise, so that the electrons in the floating gate of the flash memory are ejected. Eventually no electrons exist in the floating gate. so that the multi-level flash memory is erased. Furthermore, when a full erase of the flash memory is performed, an additional voltage is shot into gate voltage after the completion of the erase operation.

Figure 1:
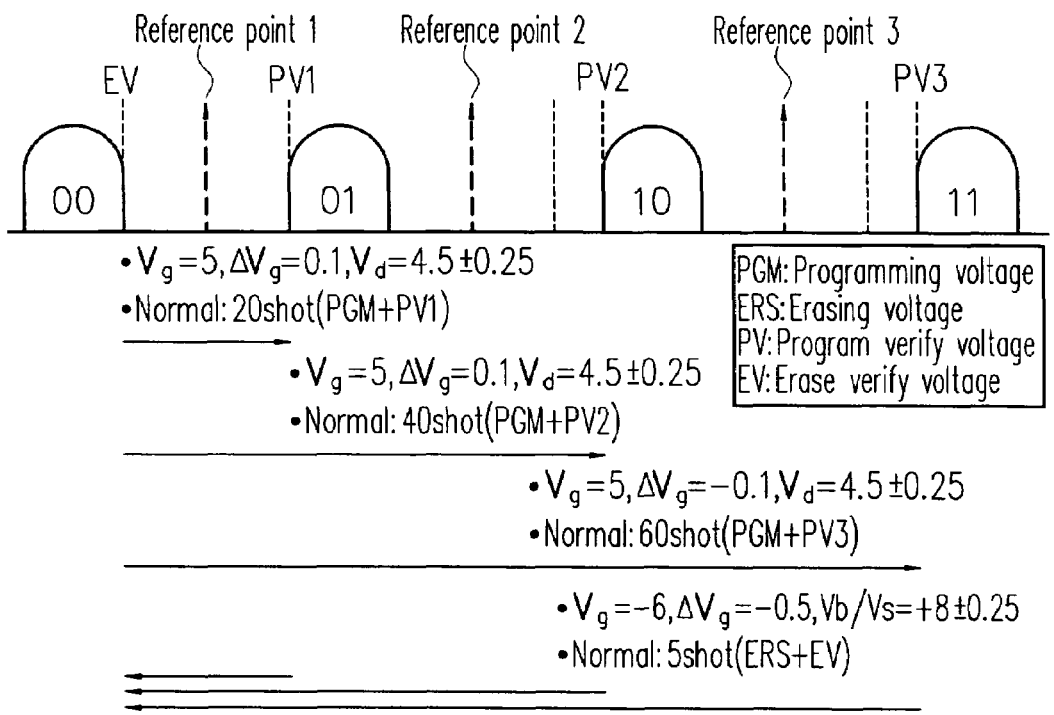
Figure 3:
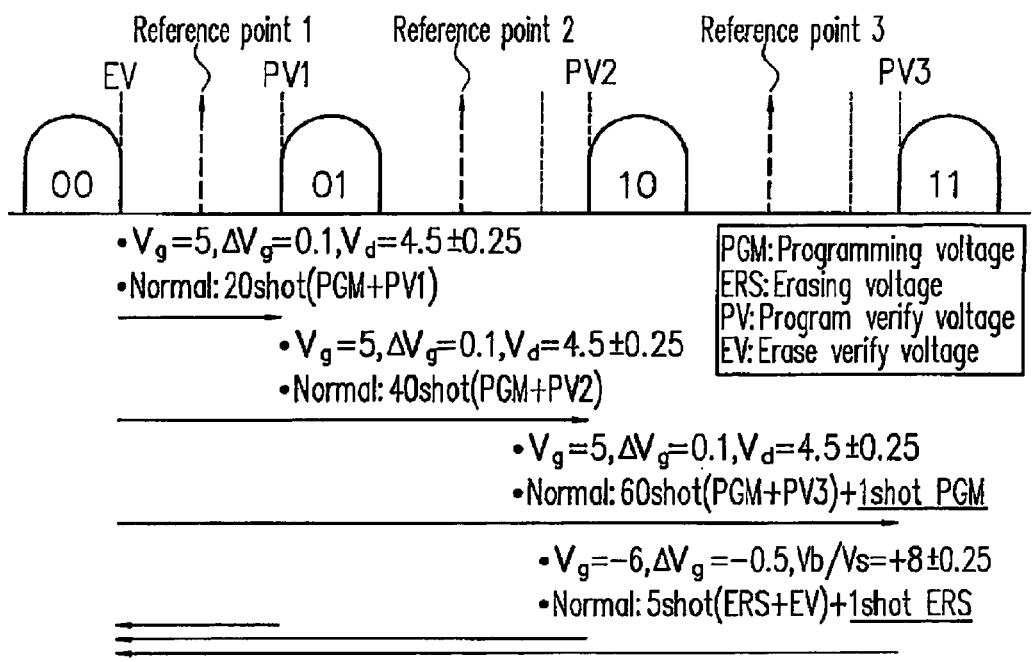
FIG. 3 schematically shows the programming and erasing method of the flash memory of the preferred embodiment according to the present invention.

The present invention adds one additional programming voltage when the highest state is programmed into the flash memory and adds one additional erase voltage when the flash memory is erased. FIG. 3 schematically shows the sketch map of the programming and erasing method of the flash memory of the preferred embodiment according to the present invention. The flash memory is programmed to 01 state from 00 state, the source of the flash memory remains grounded, and the drain voltage Vd is 4.5±0.25 volt, the gate voltage Vg starts from 5 volts, and is increased upwards by $\Delta Vg=0.1$ volt after performing 20 shots wherein 19 are programming voltage PGM and the last is programming confirmation voltage PV1.

The flash memory is programmed to 10 state from 00 state, the source of the flash memory remains ground, and the drain voltage Vd is 4.5±0.25 volt, the gate voltage Vg initially 5 volts, and is increased upward by $\Delta Vg=0.1$ volt stepwise after performing 40 shots wherein 39 are PGM shots and a last programming confirmation voltage PV2 is shot.

The flash memory is programmed to 11 state from 00 state, the source of the flash memory remains grounded, and the drain voltage Vd is 4.5±0.25 volt, the gate voltage Vg initially 5 volts, and is increased upward by $\Delta Vg=0.1$ volt each time after 61 shots wherein 59 are PGM shots and one confirmation voltage PV3 are shot, and an additional one time of PGM shot.

The flash memory performs an erase operation from state 11 to state 00, the drain is floating at the present state and the source voltage Vs or the Vb is +8±0.25 volt, the gate voltage Vg starts from −6 volts and is decreased downward by $\Delta Vg=-0.5$ volt each time after performing 6 erase voltage shots, wherein four are ERS shots, one is an erase confirmation voltage EV, and an additional erase voltage.

The increase in the number of shooting times of the programming voltage PGM into the flash memory is not limited by the highest state value. A programming voltage PGM can be increased after the last program verify voltage PV is shot when programming anyone value.

A major characteristic of the present invention is that in the programming process of the flash memory, one additional programming voltage PGM shot is added after the last program verify voltage PV is shot. In the erasing process of the flash memory, one additional erase voltage ERS shot is added after the last erase voltage ERS and erase verify shot.

Figure 4A:
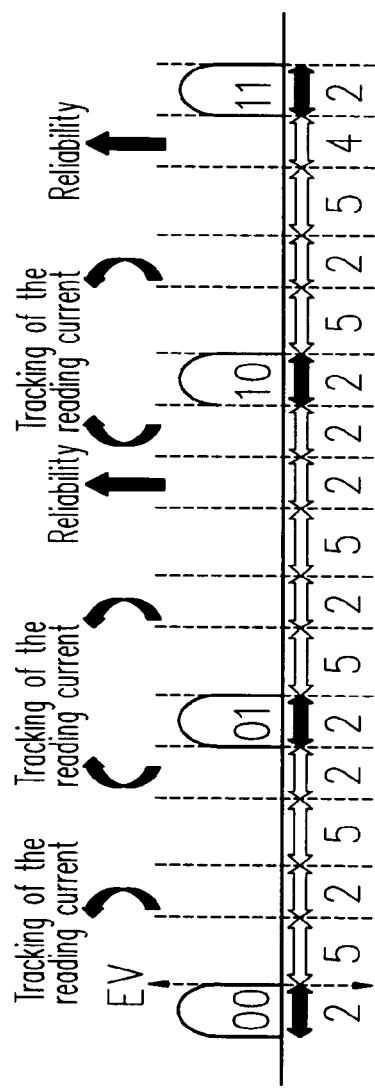
FIG. 4A schematically shows the reading current tracking diagram of the preferred embodiment according to the present invention.

The programming and erasing method of the flash memory of the preferred embodiment according to the present invention is able to obtain the reading current tracking diagram of the flash memory after the flash memory has been programmed, and the initial voltage tracking diagram of the flash memory when the flash memory is read. Please refer to FIG. 4A and FIG. 4B respectively, which respectively correspond to FIG. 2A and 2B. As shown in FIG. 4A and comparing to FIG. 2A, the tracking of the reading current Ir of the flash memory in the 11 state is removed (the dot line portion), and the tracking of the reading current Ir of the flash memory is removed when 00 state is programmed to 11 state due to the additional shot of programming voltage. This ensures that the reading current at state 11 is precisely within design limits. As a result, the removed segment in state 11 is originally used for error tolerance but now is no longer needed.

Similar to shooting an additional voltage during programming, an additional erase voltage is also shot during the erase of the multi-flash memory from state 11 to state 00. This ensures that the reading current in state 00 is precisely within the design limits. The removed segment in FIG. 2A is used for error tolerance but now is no longer needed.

The precise reading current in state 00 and state 11 due to the additional shot of program and erase voltage during programming and erasing of the multi-flash memory allows the tracking of reading current of the multi-flash memory in state 00 and state 11 to decrease. As a result, the exact state 00 and state 01 can be accurately determined.

Figure 4B:
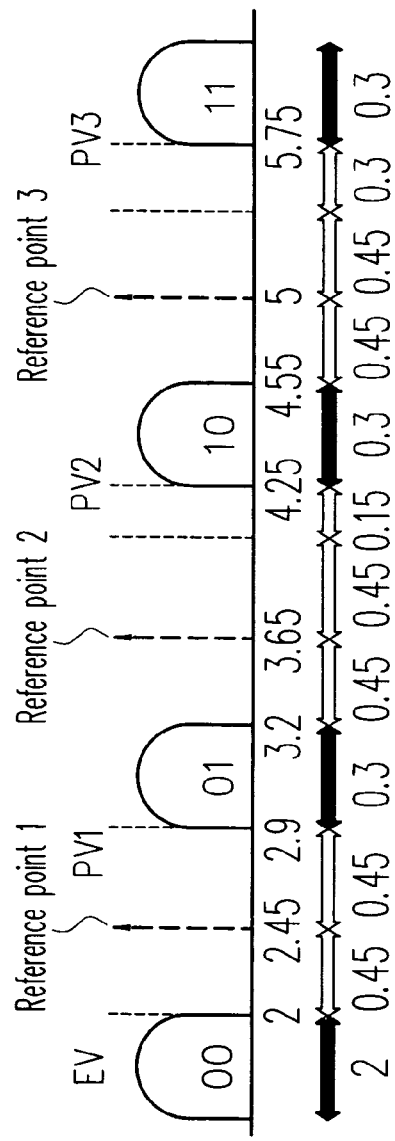
FIG. 4B schematically shows the initial voltage tracking diagram when the flash memory of the preferred embodiment according to the present invention is read.

Referring to FIG. 4B and comparing to FIG. 2B, FIG. 4B eliminated the segments represented in dotted lines in FIG. 2B. The initial operating voltage is decreased when the multi-flash memory changes state from 00 to 01 and 10 and 11. The additional shot of program and erase voltage during programming and erasing of the multi-flash memory reduces the initial operating voltage between state changes from 00 and 01, and 10 and 11. As a result, the exact state 00 and state 11 can be accurately determined.

Moreover, the present invention can be applied to the programming of any state of the flash memory, that is, the present invention is not limited to the programming of the highest value.

In summary, the present invention multi-level adds one additional programming voltage and one additional erase voltage respectively during the programming and erasing of the multi-level flash memory, the tracking of the reading current and the tracking of the initial voltage are decreased. The reduced reading current and initial voltage can accurately determine the state of the multi-flash memory. Therefore, when the multi-level flash memory is programmed, a bigger sense margin can be provided, so that fewer errors occur.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. An erasing method of a flash memory comprising a floating gate that stores electrons in programming, comprising:

applying an erasing voltage to draw electrons out of the floating gate and change a state of the flash memory to an erased state; and applying an additional erasing voltage to the flash memory after the erasing voltage is applied, wherein the additional erasing voltage is capable of adjusting the erased state of the flash memory.

2. The erasing method of claim 1, wherein the flash memory comprises a multi-level flash memory.

3. The erasing method of claim 2, wherein the erased state of the multi-level flash memory is a state of a lowest value of the multi-level.

4. The erasing method of claim 1, wherein the flash memory comprises a binary flash memory.

5. The erasing method of claim 1, wherein the erasing voltage is applied multiple times.

6. The erasing method of claim 5, wherein the erasing voltage is decreased downward stepwise each time.

* * * * *